United States Patent [19]
Takeuchi et al.

[11] Patent Number: 5,541,729
[45] Date of Patent: Jul. 30, 1996

[54] MEASURING APPARATUS UTILIZING DIFFRACTION OF REFLECTED AND TRANSMITTED LIGHT

[75] Inventors: Seiji Takeuchi, Kawasaki; Minoru Yoshii, Tokyo; Hiroyasu Nose, Zama, all of Japan

[73] Assignee: Canon Kabushiki Kaisha, Tokyo, Japan

[21] Appl. No.: 47,655

[22] Filed: Apr. 19, 1993

[30] Foreign Application Priority Data

Apr. 21, 1992 [JP] Japan .................. 4-101319

[51] Int. Cl.⁶ ...................................... G01B 9/02
[52] U.S. Cl. .................. 356/356; 356/349; 356/351; 250/237 G
[58] Field of Search ................... 356/349, 351, 356/354, 356, 363; 250/237 G

[56] References Cited

U.S. PATENT DOCUMENTS

| Re. 34,010 | 7/1992 | Magome et al. | 356/349 |
| 4,842,408 | 6/1989 | Yoshii et al. | 356/349 |
| 4,979,826 | 12/1990 | Ishizuka et al. | 356/356 |
| 5,000,542 | 3/1991 | Nishimura et al. | 350/115 |
| 5,321,502 | 6/1994 | Matsumoto et al. | 356/349 |
| 5,404,220 | 4/1995 | Takeuchi et al. | 356/349 |

FOREIGN PATENT DOCUMENTS 58-191907  11/1983  Japan .

OTHER PUBLICATIONS

"Monomode Optical Fibre Interferometers For Precision Measurement". D. A. Jackson, Intstrument Science and Technology, Dec. 1985, pp. 981–1001.

Primary Examiner—Samuel A. Turner
Assistant Examiner—Robert Kim
Attorney, Agent, or Firm—Fitzpatrick, Cella, Harper & Scinto

[57] ABSTRACT

In measuring apparatus for detecting relative displacement of a diffraction grating, a light beam is separated in an optical unit such as polarizing beam splitter into a reflected light beam and a transmitted light beam which beams are projected onto the diffraction grating. The diffracted light of the reflected and transmitted light beams are deflected by a deflection unit to be projected again onto the diffraction grating for rediffraction. The rediffracted light of the reflected and transmitted light beams are combined in the polarizing beam splitter and a detector detects the interference state of the combined rediffracted light. The deflection unit deflects the diffracted light beams of the reflected light and transmitted light so that they reenter the diffraction grating after traveling along the same optical path in the directions opposite to each other. The apparatus provides a simple configuration that prevents reduction of light intensity and provides the same optical path for both reference and displacement measuring light beams so that errors caused by fluctuation in air and heterogeneity in optical components are cancelled.

10 Claims, 8 Drawing Sheets

MEASURING APPARATUS UTILIZING DIFFRACTION OF REFLECTED AND TRANSMITTED LIGHT

BACKGROUND OF THE INVENTION

1. Field of the Invention

This invention relates to a measuring apparatus, and more particularly, to length measuring apparatus which can measure even a minute displacement of an object using a diffraction grating.

2. Description of the Related Art

So-called grating interference measuring apparatuses in which laser light is projected onto a diffraction grating, diffracted light beams generated from the grating interfere with each other, and the amount of movement of the diffraction grating is detected from a detection signal representing the interference light utilizing the phenomenon that the intensity of the interference light periodically changes in accordance with the movement of the diffraction grating, are widely used for measuring apparatuses, production apparatuses and the like because of high accuracy in detection and their small size.

Conventional grating interference measuring apparatuses which use the following approach have been known. Light emitted from a laser light source is separated into a P-component light beam and an S-component light beam by a polarizing beam splitter, and the beams are projected onto a diffraction grating. Diffracted light beams generated by the diffraction grating are again projected onto the diffraction grating by reflecting elements, and second diffracted light beams of each incident light beam travel back along their respective initial incident optical paths and again enter the polarizing beam splitter.

λ/4 plates are provided in the respective optical paths. Since the respective light beams pass through the corresponding λ/4 plates twice, the P-component light beam and the S-component light beam are converted into an S-component light beam and a P-component light beam, respectively, when reaching the polarizing beam splitter after being diffracted twice. Accordingly, the two light beams returning to the polarizing beam splitter are combined by the polarizing beam splitter, and emanate in a direction different from the direction of the laser light source. The amount of movement of the diffraction grating is detected by making the two emanating light beams interfere with each other by being passed through analyzers, and detecting the interfered light by photosensors.

In the above-described conventional approach, a single polarizing beam splitter separates light into two light beams and combines the two light beams. In order to make the direction of the light beams emanating from the polarizing beam splitter to the photosensors after being diffracted twice differ from the incident direction of light from the light source to the polarizing beam splitter, /4 plates are provided in the optical paths.

SUMMARY OF THE INVENTION

The present invention has been made in consideration of the above-described conventional approach.

It is an object of the present invention to provide a measuring apparatus in which light beams are combined by light-beam separation means, such as a polarizing beam splitter, and the configuration is simplified and the reduction of the amount of light is prevented by configuring the apparatus without members for changing the state of polarization of the light beams, such as the above-described λ/4 plates.

According to one aspect, the present invention which achieves this object relates to a measuring apparatus for detecting relative movement between an object and a diffraction grating, including a light-beam generation means, light-beam dividing unit that transmits a first light-beam component of a light beam from the light-beam generation unit to a first side and reflects a second light-beam component of the light beam to a second side. A light deflection unit projects diffracted light from the diffraction grating again onto the diffraction grating, and a detector detects relative movement of the diffraction grating by detecting interference of the diffracted light from the diffraction grating. The light-beam deflection unit projects twice-diffracted light generated by projecting diffracted light formed by projecting the first light-beam component from the light-beam dividing unit onto the diffraction grating again onto the diffraction grating onto the second side of the light-beam dividing means, and projects twice-diffracted light formed by projecting diffracted light generated by projecting the second light-beam component from the light-beam dividing unit onto the diffraction grating again onto the first side of the light-beam dividing means. The light-beam dividing unit reflects the twice-diffracted light of the second light-beam component projected onto the first side, transmits the twice-diffracted light of the first light-beam component projected onto the second side, and thereby combines the two types of twice-diffracted light. The detector detects interference of the combined light beams from the light-beam dividing unit.

According to another aspect, the present invention which achieves this object relates to measuring apparatus for detecting relative movement between an object and a diffraction grating, including a light-beam generation element that generates a light beam including a first light-beam component having a first frequency and a second light-beam component having a second frequency, a reference-signal detection unit that detects interference of the light beam from the light-beam generation element to obtain a reference signal, a light-beam dividing unit that transmits the first light-beam component of the light beam from the light-beam generation element to a first side and reflects the second light-beam component to a second side, a light deflection unit that projects diffracted light from the diffraction grating again onto the diffraction grating, and a measuring-signal detection unit that detects interference of diffracted light from the diffraction grating to obtain a detection signal for detecting relative movement of the diffraction grating. The light deflection unit projects twice-diffracted light generated by projecting diffracted light formed by projecting the first light-beam component from the light-beam dividing unit onto the diffraction grating again onto the second side of the light-beam dividing unit, and projects twice-diffracted light formed by projecting diffracted light generated by projecting the second light-beam component from the light-beam dividing unit again onto the diffraction grating onto the first side of the light-beam dividing unit. The light-beam dividing unit reflects the twice-diffracted light of the second light-beam component projected onto the first side, transmits the twice-diffracted light of the first light-beam component projected onto the second side, and thereby combines the two types of twice-diffracted light. The measuring-signal detection unit detects interference of the combined light beams from the light-beam dividing unit, and detects relative movement of the diffraction grating from a phase difference between the reference signal obtained from the reference-signal detection unit and the detection signal obtained from the measuring-signal detection unit.

It is another object of the present invention to provide measuring apparatus of a grating interference type using a heterodyne method in which two light beams generating a reference signal travel along substantially the same optical path as two light beams generating a signal for detecting displacement, whereby factors for causing errors in measurement, such as fluctuation in the air, heterogeneity in optical components, and the like, are canceled.

According to still another aspect, the present invention which achieves this object relates to a measuring apparatus for detecting relative movement between an object and a diffraction grating, including a light-beam generation element, a light deflection unit that projects a first diffrated light generated by projecting a light beam from the light-beam generation element again onto the diffraction grating and projects a second diffracted light having a diffraction order different from that of the first diffracted light generated by projecting the light beam from the lightbeam generation unit onto the diffraction grating again onto the diffraction grating. A reference-signal detection unit detects interference between the two twice-diffracted light beams, the diffraction order of each having the same absolute value and a different sign compared with the diffraction order of each of the once diffracted light beams, and a measuring-signal detection unit detects interference between the two types of twice-diffracted light, different from the corresponding two twice-diffracted light beams to be detected by the reference-signal detection units, generated from the first and second diffracted light projected again from the light deflection units onto the diffraction grating. Relative movement of the diffraction grating is detected from a phase difference between the reference signal obtained from the reference-signal detection units and the detection signal obtained from the measuring-signal detection units.

The foregoing and other objects, advantages and features of the present invention will become more apparent from the following description of the preferred embodiments taken in conjunction with the accompanying drawings.

DESCRIPTION OF THE PREFERRED EMBODIMENTS

Preferred embodiments of the present invention will now be described with reference to the drawings.

Figure 1:
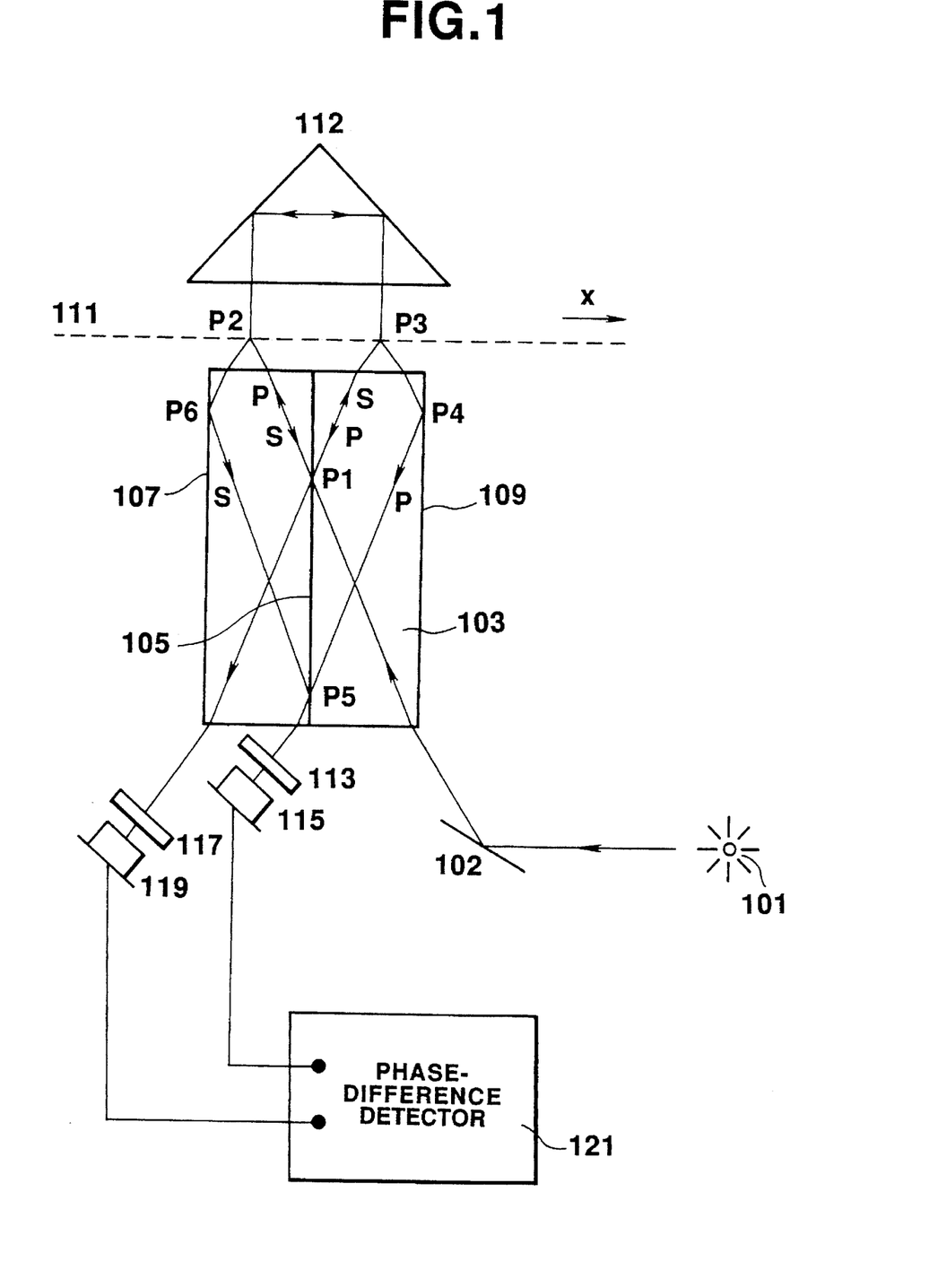
FIG. 1 is a diagram illustrating a basic optical and phase-difference detection system of the present invention.

In FIG. 1, light from a light source 101, comprising a Zeeman laser, or a light source which generates two orthogonal linearly-polarized laser light waves having different frequencies so that a beat signal of the two light waves can be observed, is projected onto polarized beam splitter unit (PBS unit) 103 via mirror 102. For example, a laser light source which generates two light waves having modulation frequencies of 80 MHz (megahertz) and 81 MHz so that a beat signal of the two light waves can be easily observed is used as the above-described light source. However, a laser light source generating light waves having a greater frequency difference is more advantageous when the speed of displacement of a grating has a large value.

Since a polarizing beam splitter 105 is formed at the center of the PBS unit 103, the incident light is separated into a transmitted P-component light beam and a reflected S-component light beam at point P1. After emanating from the PBS unit 103, the two linearly-polarized light beams are projected onto a diffraction grating 111 at points P2 and P3. At that time, the angle of the light from light source 101 is adjusted so that the +1st-order diffracted light of the P-component light beam at the point P2 and the −1st order diffracted light of the S-component light beam at the point P3 emanate in a direction perpendicular to diffraction grating 111, and the respective light beams returned after being reflected by a corner-cube prism 112 are diffracted at points P3 and P2 on diffraction grating 111.

The +1st-order diffracted light (first-time diffraction) of the P-component light beam at the point P2 is reflected by the corner-cube prism 112, and is vertically incident upon the diffraction grating 111 at the point P3. One (+1st-order diffracted light) of the twice-diffracted light beams from diffraction grating 111 is subjected to total reflection by a mirror 109 at a point P4, and again enters the polarizing beam splitter 105 at a point P5. Since this light beam is a P-component light beam, it is transmitted through polarizing beam splitter PBS (i.e., travels in the opposite direction to the light source 101 with respect to the polarizing beam splitter 105), leaves the PBS unit 103, passes through a polarizing filter 113, and is incident upon a photodetector 115. The other (−1st-order diffracted light) of the twice-diffracted light beams emanating from the point P3 is also a P-component light beam. Hence, it is transmitted through the polarizing beam splitter 105 at a point P1, passes through a polarizing filter 117, and is incident upon a photodetector 119.

The −1-st order diffracted light (first-time diffraction) of the S-component light beam at point P3 is reflected by the corner-cube prism 112, and is vertically incident upon the diffraction grating 111 at the point P2. One (−1st-order diffracted light) of the twice-diffracted light beams from the diffraction grating 111 is subjected to total reflection by a mirror 107 at a point P6, and again enters the polarizing beam splitter 105 at the point PS. Since this light beam is an S-component light beam, it is reflected by the polarizing beam splitter 105 (i.e., travels in the opposite direction to the light source 101 with respect to the polarizing beam splitter 108). At the same time, this light beam is combined with the above-described P-component light beam (the light beam subjected to +1st-order diffraction twice) at the point PS. The combined light beams pass through the polarizing filter 113, and are incident upon the photodetector 115. Since the other (+1st-order diffracted light) of the twice-diffracted light beams from the point P2 is also an S-component light beam, it is reflected by the polarizing beam splitter 105 at the point P1. At that time, it is combined with the above-described P-component light beam (first subjected to +1st-order diffraction, and then subjected to −1st-order diffraction). The combined light beams pass through polarizing filter 117, and are incident upon the photodetector 119.

Signals obtained from photodetectors 115 and 119 are optical heterodyne signals whose frequency is the difference between the frequencies of two light beams. Since the direction of polarization of polarizing filters 113 and 117 is 45° with respect to the respective planes of polarization of the P-component light beam and the S-component light beam, the P-component light beam and the S-component light beam can interfere with each other by aligning the planes of polarization of the two light beams.

If the frequency of the P-component light beam is represented by $f_1$, and $\omega_1 = 2\pi f_1$, the P-component light beam before being incident upon the diffraction grating is expressed by:

$$u_1 = a \exp\{i(\omega_1 t)\}.$$

On the other hand, if the frequency of the S-component light beam is represented by $f_2$, and $\omega_2 = 2\pi f_2$, the S-component light beam before being incident upon the diffraction grating 111 is expressed by:

$$u_2 = b \exp\{i(\omega_2 t)\}.$$

When the P-component light beam (subjected to +1st-order diffraction twice) incident upon the photodetector 115 after passing through points P1 and P2, the corner-cube prism 111, and points P3, P4 and P5 is diffracted at the point P2, a phase $\delta$ corresponding to the amount of movement x of diffraction grating 111 is added, and the phase $\delta$ is added again at the point P3. Hence, the P-component light beam incident upon photodetector 115 is expressed by:

$$u'_1 = a' \exp\{i(\omega_1 t + 2\delta)\}.$$

On the other hand, when the P-component light beam (first subjected to +1st-order diffraction, and then −1st-order diffraction) incident upon the photodetector 119 after passing through points P1 and P2, the corner-cube prism 112, and points P3 and P1 is diffracted at the point P2, the phase $\delta$ is added. However, since the phase $\delta$ is subtracted when the light beam is diffracted at point P3, the P-component light beam is expressed by:

$$u''_1 = a'' \exp\{i(\omega_1 t)\}.$$

When the S-component light beam (subjected to −1st-order diffraction twice) incident upon the photodetector 115 after passing through points P1 and P3, corner-cube prism 112, and points P2, P6 and P5 is diffracted at points P3 and P2, the phase $\delta$ corresponding to the amount of movement x of the diffraction grating is subtracted at the two points, the S-component light beam is expressed by:

$$u'_2 = b' \exp\{i(\omega_2 t - 2\delta)\}.$$

On the other hand, in the S-component light beam (first subjected to −1st-order diffraction, and then +1st-order diffraction) incident upon the photodetector 119 after passing through points P1 and P3, the corner-cube prism 112, and points P2 and P1, the phase $\delta$ is subtracted at the point P3, and the phase $\delta$ is added at the point P2. Hence, the S-component light beam is expressed by:

$$u''_2 = b'' \exp\{i\omega_2 t\}.$$

Accordingly, the optical heterodyne signal (to be used as a detection signal) after photoelectric conversion obtained from photodetector 119 is expressed by:

$$I_{PD1} = a'^2 + b'^2 + 2a'b' \cos\{(\omega_1 - \omega_2)t + 4\delta\},$$

and the optical heterodyne signal (to be used as a reference signal) after photoelectric conversion obtained from photodetector PD2 is expressed by:

$$I_{PD2} = a''^2 + b''^2 + 2a''b'' \cos\{(\omega_1 - \omega_2)t\}.$$

The frequency of these signals equals the difference between $f_1$ and $f_2$, and a phase difference of $4\delta$ is produced caused by the movement of the diffraction grating. If the grating constant of diffraction grating 111 is represented by d, the phase $\delta$ added or subtracted to diffracted light at each diffraction operation for the amount of movement x of diffraction grating GS is $\delta = 2\pi x/d$. Hence, by detecting the phase difference $4\delta$ between signals $I_{PD1}$ and $I_{PD2}$ by a phase-difference detector 121, the amount of movement x of diffraction grating 111 is obtained. If it is assumed that the grating constant of the diffraction grating is $d = 1.6$ (μm), and a phase difference of $2\pi$ (rad) is detected, $$4\delta = 4 \times (2\pi x/1.6) = 2\pi.$$

Hence, it becomes clear that the diffraction grating has moved by $x = 0.4$ (μm).

As described above, in the present embodiment, diffracted light of the P-component light beam transmitted through the polarizing beam splitter 105 is deflected by the corner-cube prism 112, and the second diffracted light of the light beam incident again upon the diffraction grating again enters the polarizing beam splitter 105 from the same side as the incident light from the light source 101 with respect to the polarizing beam splitter 105. Similarly, diffracted light of the S-component light beam reflected by the polarizing beam splitter 105 is deflected by the corner-cube prism 112, and the second diffracted light of the light beam incident again upon the diffraction grating 111 again enters the polarizing beam splitter 105 from the opposite side to the light source 106 with respect to the polarizing beam splitter 105. Thus, the direction of two light beams finally emanating from the unit 103 is different from the direction where the light source is present. Accordingly, the present embodiment is configured such that the light beams emanate in a direction different from the light source without providing $\lambda/4$ plates or the like.

In the apparatus of the present embodiment, two light beams forming a detection signal and two light beams forming a reference signal travel along the respective same optical paths until the second diffraction. Hence, even if error factors due to fluctuation in the air, heterogeneity in optical components and the like are produced in the optical paths, each signal is influenced in the same manner so as to cancel the influence.

Figure 2:
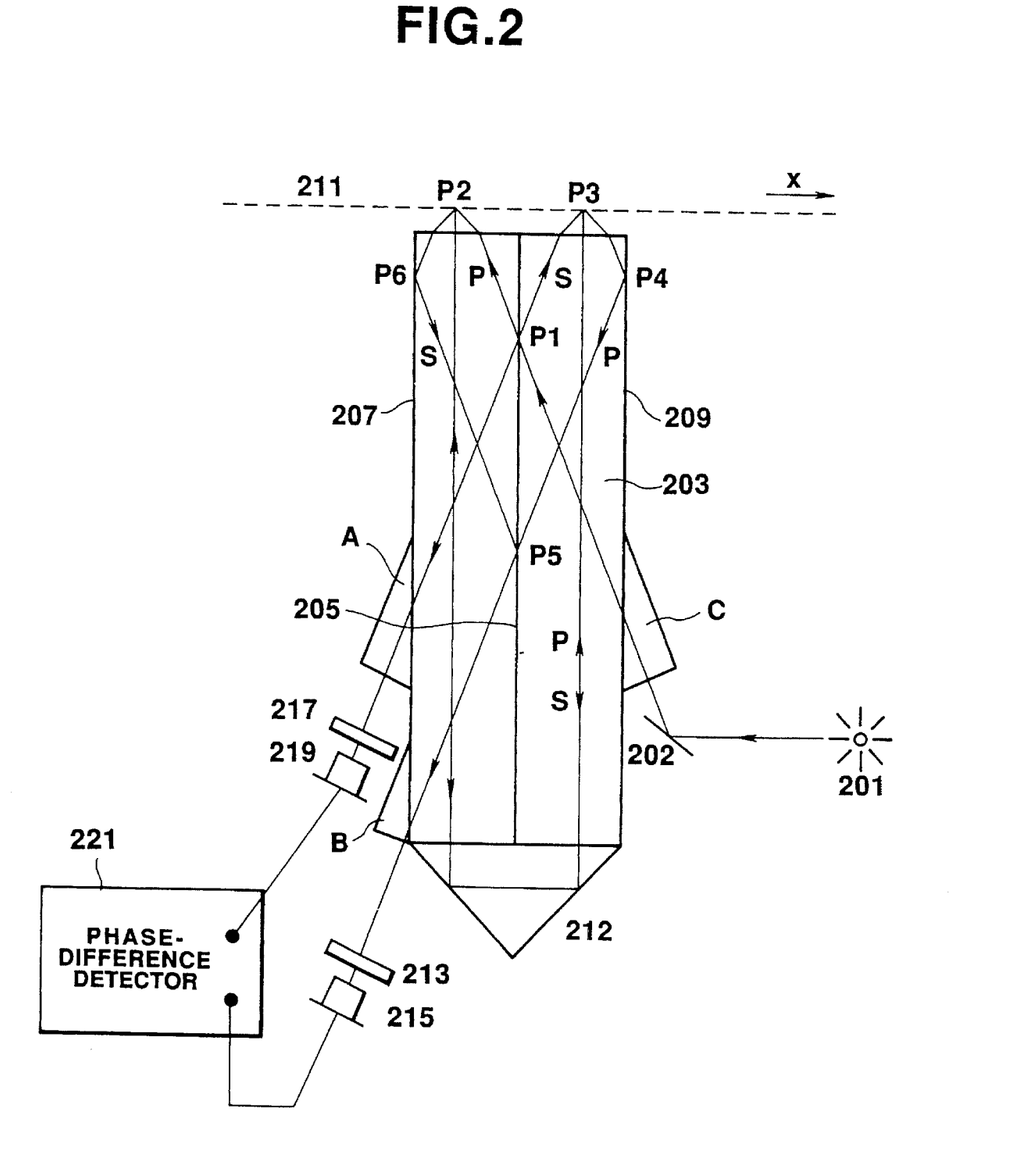
FIG. 2 is a diagram illustrating a reflection-type diffraction grating according to an embodiment of the present invention.

FIG. 2 illustrates the configuration of another embodiment of the present invention in which reflected diffracted light is used. As in the above-described embodiment, light from a light source 201 which emits two-wavelength laser light having frequencies $f_1$ and $f_2$ in which the planes of polarization of two kinds of light waves are orthogonal to each other is separated into the P-component light beam and the S-component light beam at the point P1 by the polarizing beam splitter 205 within the PBS unit 203. The respective light beams are incident upon the diffraction grating 211 at points P2 and P3. At that time, the angles of the incident light beams are adjusted so that +1st-order (reflected) diffracted light beam at the point P2 and −1st-order (reflected) diffracted light beam at the point P3 emanate vertically with respect to the diffraction grating 211. These diffracted light beams are returned to points P3 and P2 by the corner-cube prism 212, and are diffracted again.

After the second diffraction, light beams diffracted twice at the same order which are reflected by mirrors 207 and 209 at points P6 and P4, respectively, emanate in the opposite direction to the light source 201 with respect to the polarizing beam splitter 205 by polarizing beam splitter 205 while being combined at the point P5 and are incident upon the photodetector 215 after passing through the polarizing filter 213. Light beams (diffracted at different orders in the first and second diffraction) which emanate in the opposite direction to the light source 201 with respect to polarizing beam splitter 205 while being combined at the point P1, are incident upon the photodetector 219 after passing through the polarizing filter 217. The direction of polarization of polarizing filters 213 and 217 before photodetectors 215 and 219 is inclined by 45° with respect to both the P-component and the S-component light beams in order to make the two light beams interfere with each other by aligning the planes of polarization of the two light beams.

If the frequency of the P-component light beam of the light from the light source 201 is represented by $f_1$, and $\omega_1=2\pi f_1$, the P-component light beam before being incident upon the diffraction grating is expressed by:

$$u_1 = a \exp\{i(\omega_1 t)\}.$$

In the light beam (subjected to +1st-order diffraction twice) incident upon photodetector 215 after passing through points P1 and P2, the corner-cube prism 212, and points P3, P4 and P5, the phase δ caused by the amount of movement x of diffraction grating GS is added twice, and the light beam is expressed by:

$$u'_1 = a' \exp\{i(\omega_1 t + 2\delta)\}.$$

On the other hand, in the light beam incident upon the photodetector 219 after passing through points P1 and P2, the corner-cube prism 212, and points P3 and P1, the phase is added at point P2, but the phase F is subtracted at point δ P3. Hence, the light beam is expressed by:

$$u'_1 = a'' \exp\{i(\omega_1 t)\}.$$

If the frequency of the S-component light beam of the light from the light source 201 is represented by $f_2$, and $\omega_2=2\pi f_2$, the S-component light beam before being incident upon the diffraction grating is expressed by:

$$u_2 = b \exp\{i(\omega_2 t)\}.$$

In the light beam (subjected to −1st-order diffraction twice) incident upon photodetector 215 after passing through points P1 and P3, the corner-cube prism 212, and points P2, P6 and P8, the phase δ caused by the amount of movement x of diffraction grating 211 is subtracted twice. Hence, the light beam is expressed by:

$$u'_2 = b' \exp\{i(\omega_2 t - 2\delta)\}.$$

On the other hand, in the light beam (subjected to −1st-order diffraction, and then +1st-order diffraction) incident upon the photodetector 219 after passing through points P1 and P3, the corner-cube prism 212, and points P2 and P1, the phase δ is subtracted at the point P3, but the phase δ is added at the point P2. Hence, the light beam is expressed by:

$$u''_2 = b'' \exp\{i(\omega_2 t)\}.$$

The optical heterodyne signal (detection signal) obtained from the photodetector 215, after photoelectric conversion from the above-described values u'₁ and u'₂, is expressed by:

$$I_{PD1} = a'^2 = b'^2 = 2a'b' \cos\{(\omega_1-\omega_2)t = 4\delta\}.$$

The optical heterodyne signal (reference signal) obtained from the photodetector 219, after photoelectric conversion from the above-described values u''₁ and u''₂, is expressed by:

$$I_{PD2} = a''^2 + b''^2 + 2a''b'' \cos\{(\omega_1-\omega_2)t\}.$$

The frequency of signals $I_{PD1}$ and $I_{PD2}$ equals the difference between $f_1$ and $f_2$, and a phase difference of 4δ is produced in accordance with the movement of the diffraction grating. If the grating constant of diffraction grating GS is represented by d, and the amount of movement of the diffraction grating GS is represented by x, the phase δ added to or subtracted from diffracted light at one diffraction operation is expressed by:

$$\delta = 2\pi x/d.$$

Hence, by inputting the values $I_{PD1}$ and $I_{PD2}$ to the phase-difference detector, and detecting the phase difference 4δ, the amount of movement x of the diffraction grating GS can be calculated.

Figure 3:
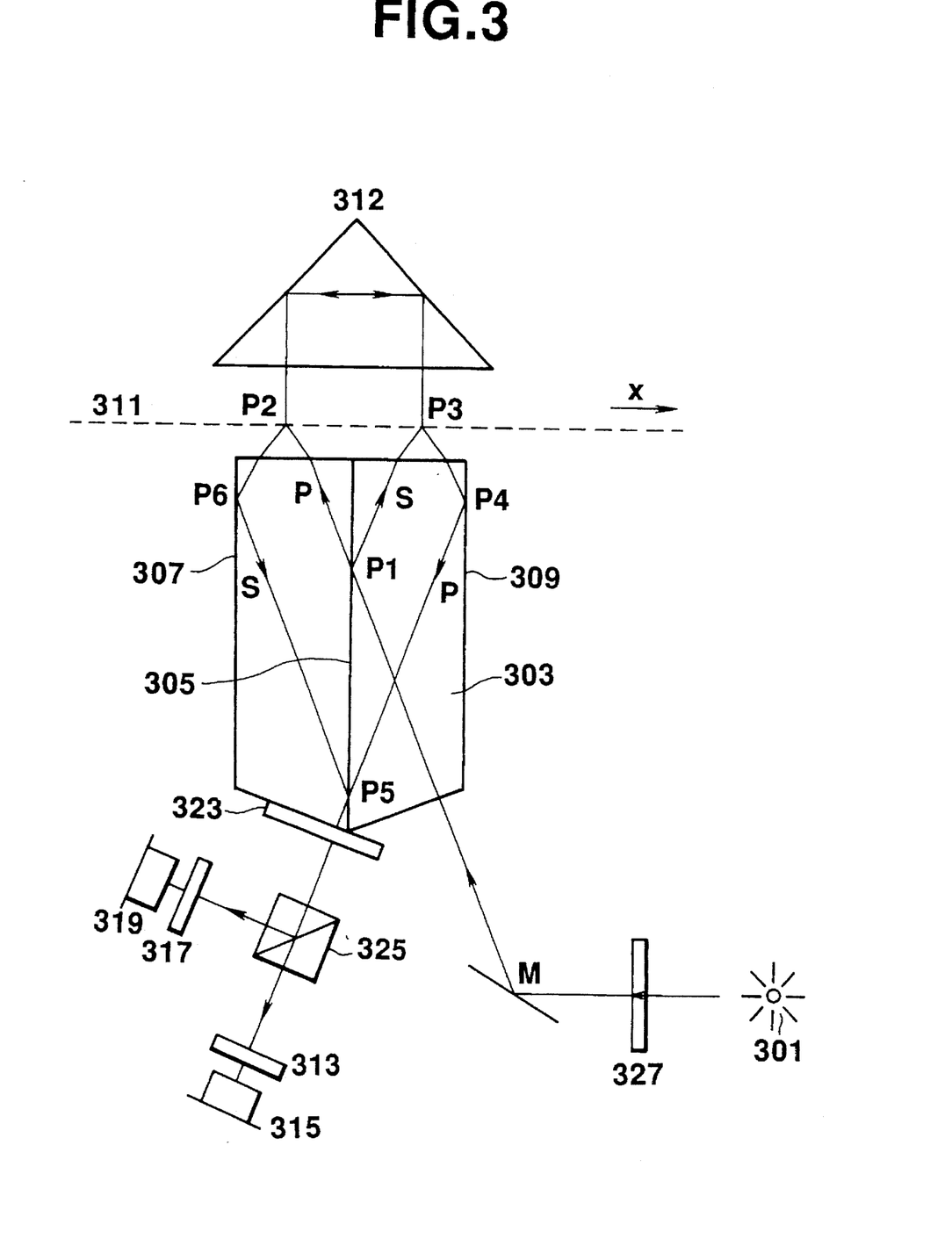
FIG. 3 is a diagram illustrating displacement of a grating measured utilizing the inclination of the plane of linear polarization without using a two-wavelength laser according to another embodiment of the present invention.

FIG. 3 illustrates still another embodiment of the present invention in which a phase difference is detected from the inclination of linearly-polarized light without using light having two frequencies as in the above-described two embodiments. One conventional approach is described in Japanese Patent Laid-open Application (Kokai) No. 58-191907 (1983). In order that the plane of polarization of light from a light source 301 generating linearly-polarized laser light has an inclination of 45° with respect to the plane of incidence to the polarizing beam splitter 305 within a PBS unit 303, a phase-difference plate is inserted. Instead of inserting the phase-difference plane 323, the light source 301 may be rotated around its optical axis.

Figure 4A:
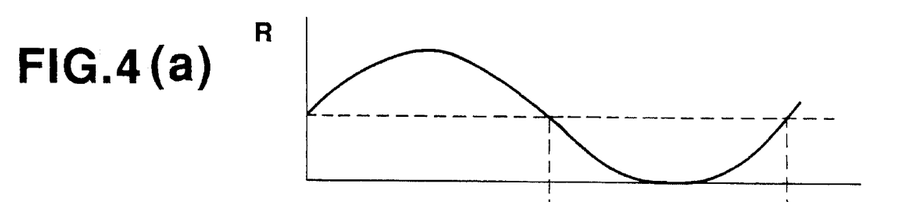
FIGS. 4(a) through 4(e) are diagrams illustrating signals from photodetectors of the measuring apparatus shown in FIG. 3 and steps of processing the signals.
Figure 4B:
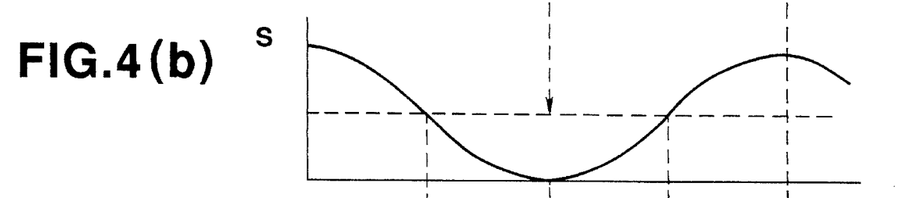

The P-component light beam and the S-component light beam of the light from the light source 301 travel along the same optical paths as the above-described two light beams for generating the detection signal in the embodiment shown in FIG. 1, and reach the point P5 of the polarizing beam splitter 305 with information relating to the phase difference caused by the amount of movement x of the diffraction grating. The two light beams are combined at point the P5, and pass through a λ4 plate 323 whose direction of polarization is inclined by 45° with respect to the surface of incidence of the polarizing beam splitter 305. The plane of polarization of linearly-polarized light passing through the plate 323 rotates in accordance with the amount of movement of the diffraction grating. The light from the plate 323 is divided into two light beams by a beam splitter 325 comprising a half-mirror or the like. Two polarizing plates 313 and 317, whose directions of polarization are inclined by 45° with each other, are provided before photodetectors 315 and 319 FIGS. 4(a) and 4(b) show signals obtained from photodetectors 315 and 319 when the diffraction grating 311 is displaced in the x direction at a constant speed.

Figure 4C:
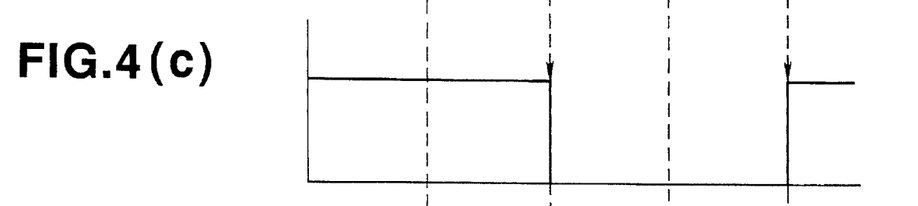
Figure 4D:
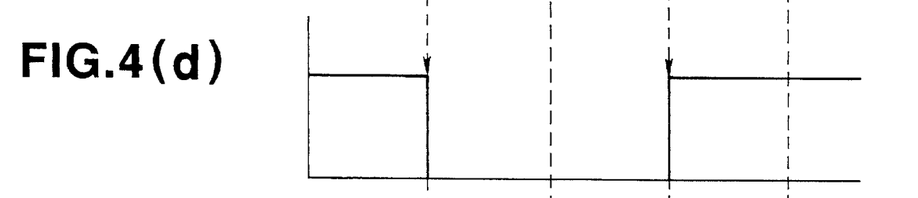
Figure 4E:
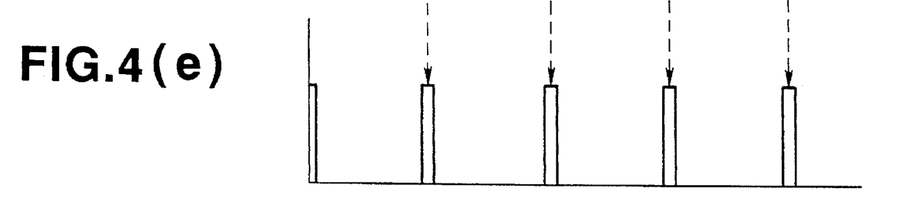

That is, when the diffraction grating is displaced in one direction at a constant speed, the plane of polarization rotates. The directions of polarization of polarizing plates 313 and 317 provided before photodetectors 315 and 319 are inclined by 45° with each other. Hence, when the diffraction grating is displaced at a constant speed, the phases of signals representing the intensities of the light beams as a result of photoelectric conversion are shifted by 90° with respect to each other as indicated by R and S shown in FIGS. 4(a) and 4(b), respectively. Accordingly, by performing binary-coding processing of the two signals, as shown in FIGS. 4(c)

and 4(d), generating pulses with timings of the leading and trailing edges of signals obtained by the binary-coding processing, and counting the number of the pulses, the amount of movement of diffraction grating 311 can be counted. At the time of the counting, addition or subtraction may be determined in consideration of the direction of movement of diffraction grating 311.

Figure 5:
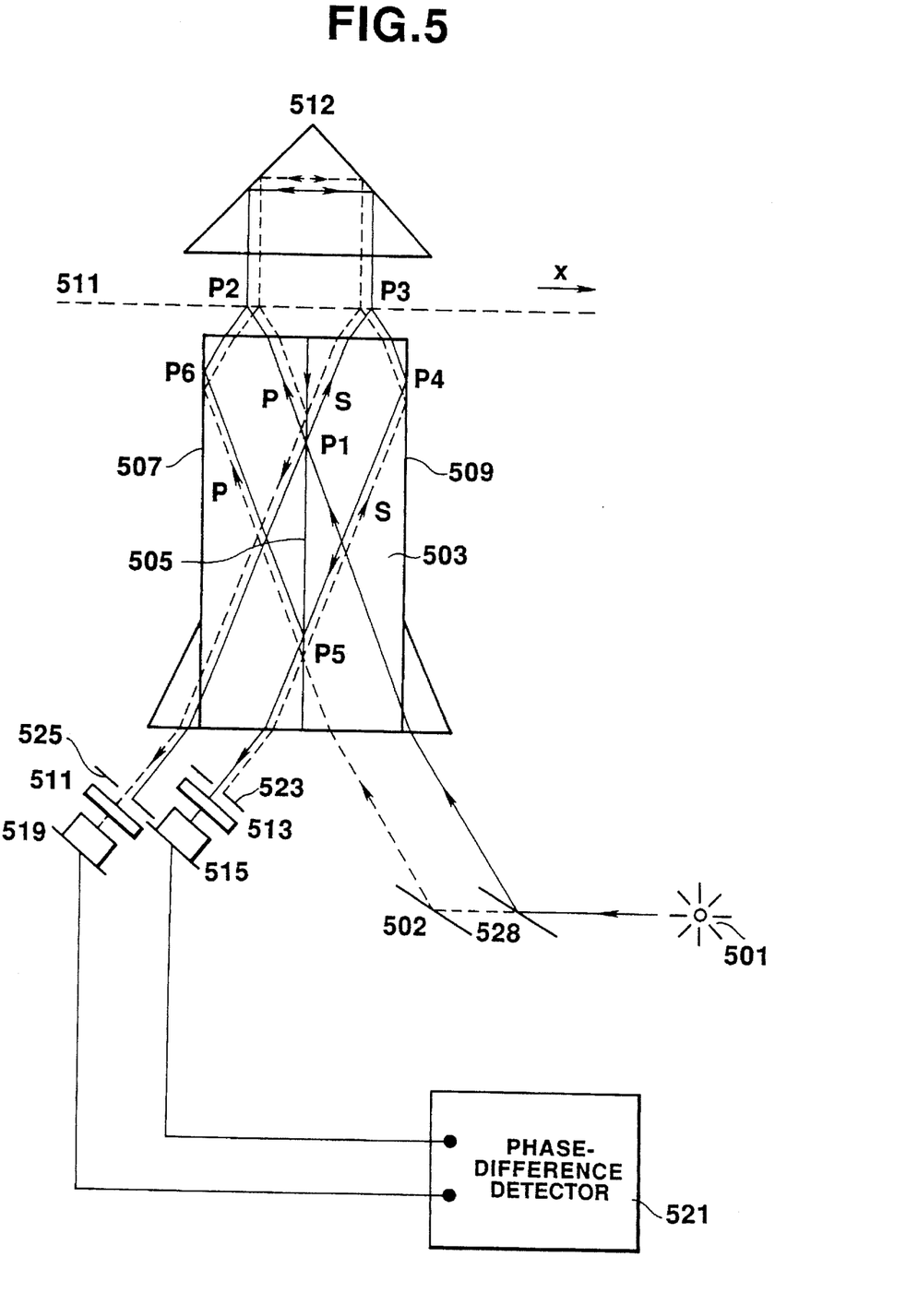
FIG. 5 is a diagram illustrating a method for obtaining twofold resolution according to still another embodiment of the present invention.

Although in the above-described three embodiments, the polarized light beams are directly incident upon the diffraction grating after they are separated by polarizing beam splitter 305, the same effect may be obtained by first reflecting the polarized light beams by a total-reflection mirror and then projecting them onto the diffraction grating after being separated by polarizing beam splitter 305, as indicated by optical paths represented by broken lines shown in FIG. 5 (to be described later).

FIG. 5 illustrates still another embodiment of the present invention in which resolution is doubled compared with the embodiments shown in FIGS. 1 and 2.

Light from a light source 501 which generates two kinds of light waves having different wavelengths whose planes of polarization are orthogonal with each other, such as a Zeeman laser or the like, is divided into two light beams by a half-mirror 528. One of the light beams travels along the same optical path as in the case of the two light beams for generating the detection signal in the embodiment shown in FIG. 1. If the frequency of the P-component light beam is represented by $f_1$, and $\omega_1=2\pi f_1$, and the frequency of the S-component light beam is represented by $f_2$, and $\omega_2=2\pi f_2$, the phase $\delta$ of the diffraction grating is added or subtracted at each diffraction operation, and the P-component light beam (subjected to +1st-order diffraction twice) incident upon a photodetector 575 is represented by:

$$u'_1 = a' \exp\{i(\omega_1 t + 2\delta)\}.$$

and the S-component light beam (subjected to −1st-order diffraction twice) is represented by:

$$u'_2 = b' \exp\{i(\omega_2 t - 2\delta)\}.$$

Accordingly, the optical heterodyne signal obtained from the photodetector 515, after photoelectric conversion, is expressed by:

$$I_{PD1} = a'^2 + b'^2 + 2a'b' \cos\{(\omega_1 - \omega_2)t + 4\delta\}.$$

The other light beam separated by the half-mirror 528 travels along the optical paths indicated by broken lines shown in FIG. 5, and is incident upon a photodetector 519, while the phase of the diffraction grating is added or subtracted at each diffraction operation. That is, the P-component light beam and the S-component light beam indicated by the broken lines travel substantially along the same optical paths as the optical paths of the P-component light beam and the S-component light beam indicated by solid lines in the opposite directions, respectively, after being separated by a polarizing beam splitter 505 until being combined, and travel toward the photodetector 519 after being combined. However, the optical paths are slightly shifted, and a pinhole 525 is provided before the photodetector 519 so that light indicated by the solid line is not mixed in the photodetector 519. (The similar pinhole 523 is provided before the photodetector 515 so that light indicated by the broken line is not mixed.) The P-component light beam (subjected to −1st-order diffraction twice) indicated by the broken lines is expressed by:

$$u''_1 = a'' \exp\{i(\omega_1 t + 2\delta)\}.$$

Similarly, the S-component light beam (subjected to +1st order diffraction twice) indicated by the broken lines is expressed by:

$$u''_2 = b'' \exp\{i(\omega_2 t - 2\delta)\}.$$

Hence, the optical heterodyne signal obtained from the photodetector 519, after photoelectric conversion, is expressed by:

$$I_{PD2} = a''^2 + b''^2 + 2a''b'' \cos\{(\omega_1 - \omega_2)t + 4\delta\}.$$

The signals from the photodetectors 515 and 519 have the same frequency, and a phase difference of 8 $\delta$ is produced in accordance with the movement of the diffraction grating. Since the phase added to or subtracted from each diffracted light at one diffraction operation in accordance with the movement of diffraction grating 511 is expressed by:

$$\delta = 2\pi x/d,$$

where d is the grating constant, the displacement of the grating can be calculated from the phase difference detected by a phase-difference detector 521. In the present embodiment, the phase difference produced for a predetermined amount of movement of the diffraction grating equals 8 $\delta$, which is twice the phase difference 4 $\delta$ in the abovedescribed embodiments shown in FIGS. 1 and 2.

The above-described method of increasing resolution shown in FIG. 5 can also be applied to a reflection-type diffraction grating by configuring the arrangement of FIG. 5 so that the corner-cube prism is disposed in close contact with the PBS unit at the opposite side to the diffraction grating of the PBS unit.

Figure 6:
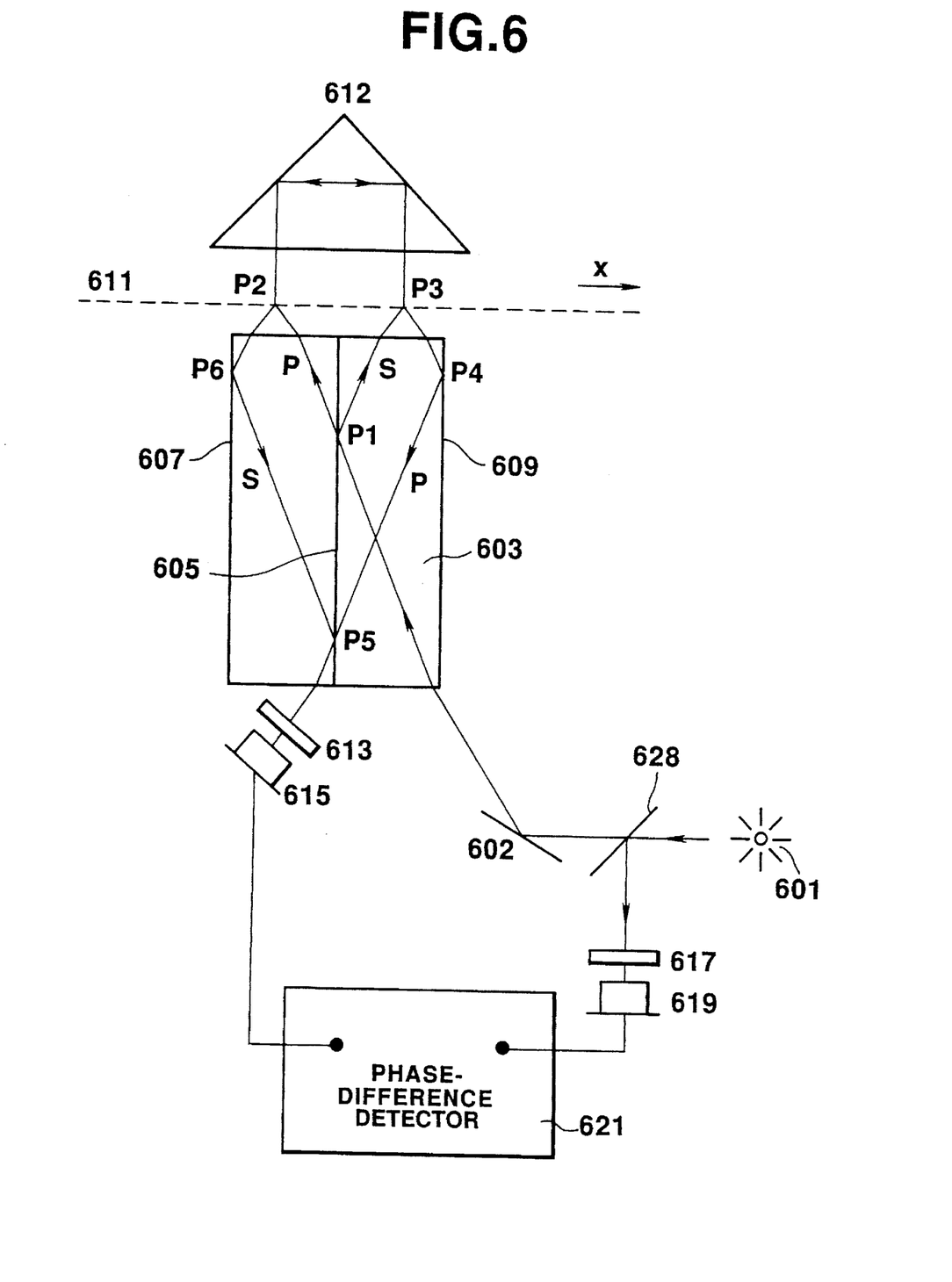
FIGS. 6 through 8 are diagrams illustrating still other embodiments of the present invention.

FIG. 6 illustrates a still another embodiment of the present invention.

In FIG. 6, light emitted from a light source 601 comprises two-frequency laser light in which the planes of polarization of two kinds of waves are orthogonal with each other and the frequencies of the two waves differ so that a beat signal made by them can be electrically detected after photoelectric conversion. The light from the light source 601 is first separated into two light beams by a half-mirror 628. The light beam reflected by half-mirror 628 is subjected to photoelectric conversion by a photodetector 619. At that time, a polarizing plate 617 is provided before the photodetector 619 whose direction of polarization is 45° with respect to each wave of the two-frequency laser light in order to align the polarized waves to make them interfere with each other. The signal obtained from the photodetector 619 is a beat signal whose frequency equals the difference between the frequencies of the two waves.

The light beam passing through the half-mirror 628 enters a PBS unit 603 which includes a polarizing beam splitter 605 at its center and two total-reflection mirrors 607 and 609 at both sides. The light beam entering the polarizing beam splitter 605 is separated into the P-component light beam and the S-component light beam, which are incident upon a diffraction grating 611 at points P2 and P3, respectively. The direction of the light beam entering the PBS unit 603 is arranged so that diffracted light beams from points P2 and P3 vertically emanate from the grating. The system is arranged so that the two diffracted light beams are reflected by a corner-cube prism 612, and the light beams from points P3 and P2 are incident upon points P2 and P3, respectively. After being incident upon the diffraction grating again and diffracted at the same diffraction order as that in the first time, the P-component light beam is reflected at a point P4 of the total-reflection mirror 609, and the S-component light beam is reflected at a point P6 of the total-reflection mirror 607. Thereafter, the P-component light beam passes through a point P5 of the 605, the S-component light beam is reflected at the point P5, and both light beams are incident upon a photodetector 615. At that time, a polarizing plate 613 whose direction of polarization is 45° in order to align the directions of polarization of the two polarized light beams to make them interfere with each other is provided before the photodetector 615. The signal obtained from the photodetector 615 is a beat signal whose frequency equals the difference between the two light beams, and the phase of the diffraction grating 611 is added to the phase of the signal.

By inputting the signals from photodetectors 615 and 619 in a phase-difference detector 621, the phase difference between the two beat signals is detected. Since this phase difference corresponds to the amount of displacement of the diffraction grating, the displacement of the grating can be measured from the pitch of the grating and the phase difference in the following manner.

The phase $\delta$ to be added to or subtracted from each diffracted light at one diffraction operation is represented by:

$$\delta = 2\pi x/d,$$

where d is the grating constant of the diffraction grating, and x is the amount of displacement. Since the detected phase difference between the two beat signals is $4\delta$, the amount of displacement x is $x=(d \times 4\delta)/(4 \times 2\pi)$.

Figure 7:
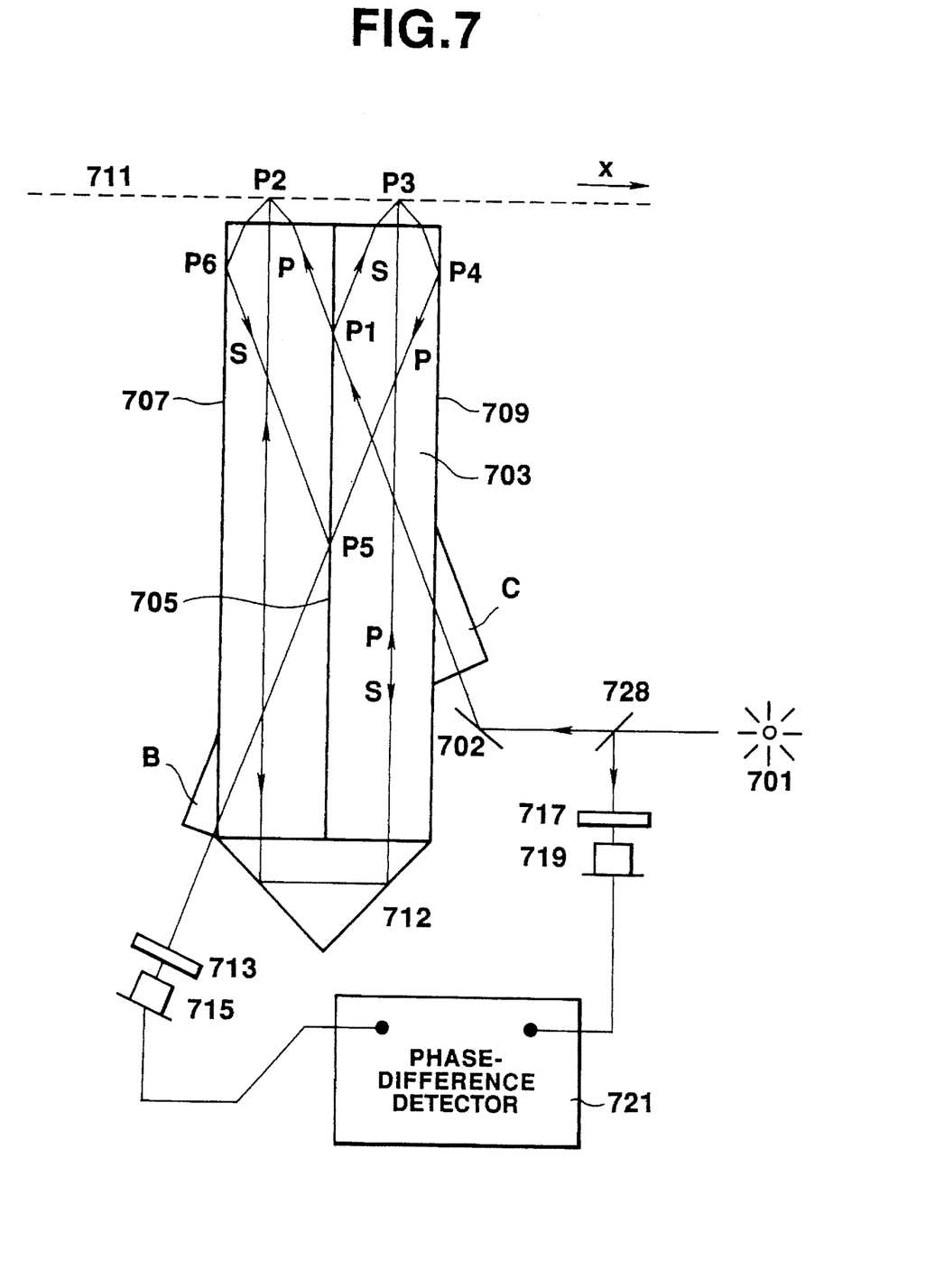

FIG. 7 illustrates the configuration of still another embodiment of the present invention in which reflected diffracted light is applied in the embodiment shown in FIG. 6. As in the above-described embodiment, light from a light source 701 generating two-wavelength laser light waves having slightly different two frequencies $f_1$ and $f_2$ whose planes of polarization are orthogonal to each other is separated into two light beams by a half-mirror 728. One of the light beams is incident upon a photodetector 719 after passing through a polarizing filter 717 to be subjected to photoelectric conversion, and a beat signal is detected.

The other light beam passes through the same optical paths as the two light beams for generating the detection signal in the embodiment shown in FIG. 2. That is, the light beam is separated into a P-component light beam and an S-component light beam at a point P1 by a polarizing beam splitter 705 within a PBS unit 703, and the respective light beams enter a diffraction grating 711 at points P2 and P3. At that time, the angle of the incident light from the light source 701 is adjusted so that the +1st-order reflected diffracted light beam at the point P2 and the −1st-order reflected diffracted light beam at the point P3 emanate vertically with respect to the diffraction grating 711. These diffracted light beams are returned to points P3 and P2 by a corner-cube prism 712, and are again subjected to diffraction of the same order. The light beams after the second diffraction are reflected by mirrors 709 and 707 at points P4 and P6, respectively. The reflected light beams are emanated in the opposite direction to the light source 701 with respect to polarizing beam splitter 705 by polarizing beam splitter 705 while being combined at a point P5, and are incident upon a photodetector 715 after passing through a polarizing filter 713. The direction of polarization of the respective polarizing filters 713 and 715 before photodetectors 715 and 719 is 45° with respect to the directions of polarization of the P-component light beam and the S-component light beam in order to align the plane of polarization of the two polarized light beams having different frequencies to make them interfere with each other.

If the frequency of the P-component light beam is represented by $f_1$, and $\omega_1 = 2\pi f_1$, the P-component light beam before entering the diffraction grating is expressed by:

$$u_1 = a \exp\{i(\omega_1 t)\}.$$

If the frequency of the S-component light beam is represented by $f_2$, and $\omega_2 = 2\pi f_2$, the S-component light beam before entering the diffraction grating is expressed by:

$$u_2 = b \exp\{i(\omega_2 t)\}.$$

In the light beam (subjected to +1st-order reflecting diffraction twice) incident upon photodetector 715 after passing through points P1 and P2, the corner-cube prism 712, and points P3, P4 and P5, the phase $\delta$ caused by the amount of movement x of diffraction grating 711 is added twice, and the light beam is expressed by:

$$u'_1 = a' \exp\{i(\omega_1 t + 2\delta)\}.$$

In the light beam (subjected to −1st-order reflecting diffraction twice) incident upon the photodetector 715 after passing through points P1 and P3, the corner-cube prism 712, and points P2, P6 and P5, the phase $\delta$ caused by the amount of movement x of diffraction grating 711 is subtracted twice, and the light beam is expressed by:

$$u'_2 = b' \exp\{i(\omega_2 t - 2\delta)\}.$$

Since the phase does not change in the light beam reflected by the half-mirror 728, the P-component light beam is expressed by:

$$u''_1 = a'' \exp\{i(\omega_1 t)\},$$

and the S-component light beam is expressed by:

$$u''_2 = b'' \exp\{i(\omega_2 t)\}.$$

The optical heterodyne signal (detection signal) obtained from photodetector PD1, after photoelectric conversion from the above-described values $u'_1$ and $u'_2$, is expressed by:

$$I_{PD1} = a'^2 + b'^2 + 2a'b' \cos\{(\omega_1 - \omega_2)t + 4\delta\},$$

and the optical heterodyne signal (reference signal) obtained from the photodetector 719, after photoelectric conversion from the above-described values $u''_1$ and $u''_2$, is expressed by:

$$I_{PD2} = a''^2 + b''^2 + 2a''b'' \cos\{(\omega_1 - \omega_2)t\}.$$

The frequency of signals $I_{PD1}$ and $I_{PD2}$ equals the difference between $f_1$ and $f_2$, and a phase difference of $4\delta$ is produced in accordance with the movement of the diffraction grating. If the grating constant of the diffraction grating 711 is represented by d, and the amount of movement of the diffraction grating 711 is represented by x, the phase $\delta$ added to or subtracted from diffracted light at one diffraction operation is expressed by:

$$\delta = 2\pi x/d.$$

Hence, by inputting the values $I_{PD1}$ and $I_{PD2}$ to the phase-difference detector, and detecting the phase difference $4\delta$, the amount of movement x of the diffraction grating 711 can be calculated.

In each of the embodiments shown in FIGS. 1, 2, 3, 6 and 7, the light entering the PBS unit from light source is separated into polarized light beams by a polarizing beam splitter, and the polarized light beams are directly incident upon a diffraction grating. In the following embodiment shown in FIG. 8, however, light entering a PBS unit from a light source 801 is separated into two polarized light beams by a polarizing beam splitter 805, and the polarized light beams are incident upon a diffraction grating after being reflected by total-reflection mirror 807 and 809.

Figure 8:
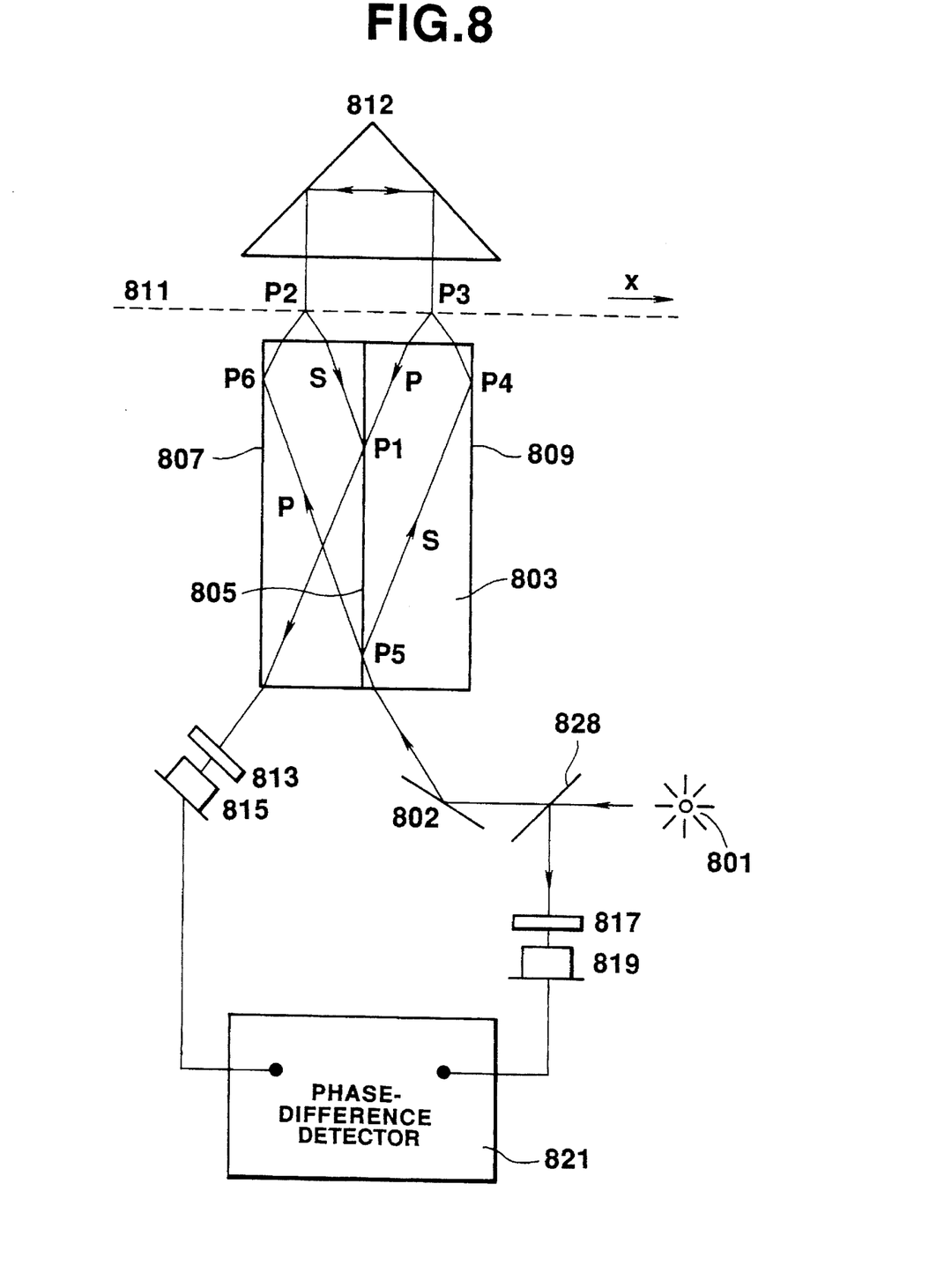

Since the light reflected by a half-mirror 828 is the same as the two light beams for generating the reference signal in the embodiment shown in FIG. 7, a photodetector 819 shown in FIG. 8 obtains the same optical heterodyne signal as the photodetector 719 shown in FIG. 7. Since the light passing through the half-mirror 828 and entering the PBS unit 803 travels the same optical paths as the P-component light beam and the S-component light beam indicated by the broken lines in the embodiment shown in FIG. 5, the optical heterodyne signal (detection signal) obtained from photodetector 519 shown in FIG. 8 is expressed by the same expression for the optical heterodyne signal obtained from the photodetector 819 shown in FIG. 5. Accordingly, a phase difference of 4 δ is present between the optical heterodyne signal (reference signal) from the photodetector 819 and the optical heterodyne signal (detection signal) from the photodetector 815 shown in FIG. 8. By detecting this phase difference by phase-difference detector 821, the amount of displacement of the diffraction grating can be calculated.

In the above-described embodiments, a roof prism or a cat's-eye optical system may be used instead of the corner-cube prism. As disclosed and shown in "Optical System Design" by R. Kingslake, Academic Press, Inc., 1983 and disclosed in U.S. Pat. No. 5,000,542 issued Mar. 19, 1991, a cat's eye optical system has a reflecting surface disposed near the focal plane so that the optical path is unaffected by variations of the angle of diffraction of a diffracted light beam.

As described above, according to the present invention, it is possible to simplify the configuration of an apparatus, and to prevent a loss in the amount of light. Furthermore, it is possible to realize the configuration of an apparatus in which influence of fluctuation in the air, heterogeneity in optical components, and the like is reduced.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A measuring apparatus for detecting relative displacement of a diffraction grating, said apparatus comprising:

a polarizing beam splitter for separating light from a light source into a P-component light beam and an S-component light beam, and projecting the separated light beams onto the diffraction grating, wherein the polarizing beam splitter transmits the P-component light beam and reflects the S-component light beam;

deflection means for projecting diffracted light of the separated light beams from the diffraction grating so that the diffracted light of the P-component light beam will enter the polarizing beam splitter from the side opposite to the side which the P-component light beam emanated to and so that the diffracted light of the S-component light beam will enter the polarizing beam splitter from the side opposite to the side which the S-component light beam emanated to, whereby the diffracted light of the S-component light beam and the P-component light beam is combined; and detection means for detecting a state of interference of the combined diffracted light.

2. A measuring apparatus according to claim 1, wherein said deflection means makes the diffracted light of the reflected light beam and the diffracted light of the transmitted light beam travel along the same optical path in directions opposite to each other.

3. A measuring apparatus according to claim 1, wherein said deflection means comprises a corner cube.

4. A measuring apparatus according to claim 1, wherein said deflection means comprises a cat's-eye optical system.

5. A measuring apparatus for detecting relative displacement of a diffraction grating, said apparatus comprising:

a two-frequency laser light source which emits two orthogonally polarized light waves whose frequencies differ so that a beat signal made by the two waves can be electrically measured;

a polarizing beam splitter for separating light from said light source into a P-component light beam and an S-component light beam and for projecting the separated light beams onto the diffraction grating, wherein the polarizing beam splitter transmits the P-component light beam and reflects the S-component light beam;

deflection means for deflecting the diffracted light of the separated light beams from the diffraction grating so that the diffracted light of the P-component light beam will enter the polarizing beam splitter from the side opposite to the side which the P-component light beam emanated to and so that the diffracted light of the S-component light beam will enter the polarizing beam splitter from the side opposite to the side which the S-component light beam emanated to, whereby the diffracted light of the S-component light beam and the P-component light beam is combined; and detection means for detecting a state of interference of the combined diffracted light.

6. A measuring apparatus according to claim 5, wherein said light source comprises a Zeeman laser.

7. A measuring apparatus for detecting relative displacement of a diffraction grating, said apparatus comprising:

reference-signal detection means for receiving a part of a light beam from a multifrequency light source emitting light waves whose frequencies differ so that a beat signal made by the light waves can be electrically measured, and for detecting a state of interference of the part of the light beam;

separation means for separating a light beam other than the part of the light beam into a reflected light beam and a transmitted light beam, and for projecting the reflected and transmitted light beams onto the diffraction grating;

deflection means for projecting diffracted light of the reflected light beam and the transmitted light beam from the diffraction grating again onto the diffraction grating;

combining means formed by said separating means for combining rediffracted light of the reflected light beam and the transmitted light beam from the diffraction grating; and measuring-signal detection means for detecting a state of interference of the combined rediffracted light, wherein said deflection means deflects the diffracted light beams of the reflected light beam and of the transmitted light beam so that the diffracted light beams will travel along the same optical path in directions opposite to each other, and deflects the diffracted light beams so that rediffracted light of the reflected light beam will enter said combining means from the side opposite to the side which the reflected light beam emanated to and rediffracted light of the transmitted light beam will enter said combining means from the side opposite to the side which the transmitted light beam emanated to.

8. A measuring apparatus according to claim 7, further comprising a phase-difference detector for detecting relative displacement of the diffraction grating from a phase difference between a reference signal obtained from said reference-signal detection means and a measuring signal obtained from said measuring-signal detection means.

9. A measuring apparatus for detecting relative displacement of a diffraction grating, said apparatus comprising:

separation means for separating a light beam from a light source into a reflected light beam and a transmitted light beam, and for projecting the reflected and transmitted light beams onto the diffraction grating;

deflection means for projecting first diffracted light of the reflected light beam from the diffraction grating again onto the diffraction grating, and for projecting a second diffracted light, whose diffraction order differs from the diffraction order of the first diffracted light, of the transmitted light beam from the diffraction grating again onto the diffraction grating;

combining means formed by the separating means for combining rediffracted light of the reflected light beam and the transmitted light from the diffraction grating;

reference-signal detection means for detecting a state of interference between two rediffracted light beams from said combining means, the diffraction order of each having the same absolute value and a different sign compared with the diffraction order of each of the first and second diffracted light from among respective rediffracted light beams generated from the first and second diffracted light by the diffraction grating; and measuring-signal detection means for detecting a state of interference between two rediffracted light beams different from the rediffracted light beams detected by said reference-signal detection means from among respective rediffracted light beams generated from the first and second diffracted light by the diffraction grating, wherein said deflection means deflects the diffracted light beams of the reflected light beam and transmitted light beam so that they reenter said diffraction grating after travelling along the same optical path in directions opposite to each other, and deflects the diffracted light so that rediffracted light of the reflected light beam will enter the combining means from the side opposite to the side which the reflected light beam emanated to and rediffracted light of the transmitted light beam will enter said combining meads from the side opposite to the side which the transmitted light beam emanated to.

10. A measuring apparatus according to claim 9, further comprising a phase-difference detector for detecting relative displacement of the diffraction grating from a phase difference between a reference signal obtained from said reference-signal detection means and a measuring signal obtained from said measuring-signal detection means.

* * * * *

UNITED STATES PATENT AND TRADEMARK OFFICE
CERTIFICATE OF CORRECTION

PATENT NO. : 5,541,729
DATED : SEIJI TAKEUCHI ET AL.
INVENTOR(S) : July 30, 1996

Page 1 of 3

It is certified that error appears in the above-identified patent and that said Letters Patent is hereby corrected as shown below:

COLUMN 1

Line 56, "/4 plates" should read --$\lambda$/4 plates--.

COLUMN 5

Line 63, "u"$_2$=b" exp {i$\omega_2$t)}." should read
--u"$_2$=b" exp {i($\omega_2$t)}.--.

COLUMN 7

Line 35, "phase" should read --phase $\delta$--.
Line 36, "phase F" should read --phase $\delta$--.
Line 37, "$\delta$" should be deleted.
Line 50, "P8," should read --P5,--.

COLUMN 8

Line 1, "I$_{PD1}$=a'$^2$=b'$^2$=2a'b'cos{($\omega_1$-$\omega_2$)t=4$\delta$})." should read
--I$_{PD1}$=a'$^2$+b'$^2$+2a'b'cos{($\omega_1$-$\omega_2$)t+4$\delta$}.--.

COLUMN 10

Line 10, "I$_{PD2}$=a"$^2$=b"$^2$+2a"b"cos{($\omega_1$-$\omega_2$)t4$\delta$})." should read --I$_{PD2}$=a"$^2$+b"$^2$+2a"b"cos{($\omega_1$-$\omega_2$)t+4$\delta$}.--.
Line 33, "a" should be deleted.

UNITED STATES PATENT AND TRADEMARK OFFICE
CERTIFICATE OF CORRECTION

PATENT NO. : 5,541,729

DATED : SEIJI TAKEUCHI ET AL.

INVENTOR(S) : July 30, 1996

It is certified that error appears in the above-identified patent and that said Letters Patent is hereby corrected as shown below:

COLUMN 12

Line 14, "$u'_1 a' \exp\{i(\omega_1 t + 2\delta)\}.$" should read --$u'_1 = a' \exp\{i(\omega_1 t + 2\delta)\}.$--.

Line 19, "PS," should read --P5,--.

Line 38, "$\{(\omega_1 - \omega_2)t + 4\delta)\},$" should read --$\{(\omega_1 - \omega_2)t + 4\delta\},$--.

COLUMN 13

Line 14, "detector 519" should read --detector 815--.

Line 16, "photodetector 819" should read --photodetector 519--.

COLUMN 15

Line 29, "light" should read --light beam--.

UNITED STATES PATENT AND TRADEMARK OFFICE
CERTIFICATE OF CORRECTION

PATENT NO.   : 5,541,729
DATED        : SEIJI TAKEUCHI ET AL.
INVENTOR(S)  : July 30, 1996

Page 3 of 3

It is certified that error appears in the above-identified patent and that said Letters Patent is hereby corrected as shown below:

<u>COLUMN 16</u>

Line 23, "meads" should read --means--.

Signed and Sealed this

Eleventh Day of February, 1997

Attest:

BRUCE LEHMAN

Attesting Officer     Commissioner of Patents and Trademarks